United States Patent [19]

Pauker

[11] 4,283,694

[45] Aug. 11, 1981

[54] IMPEDANCE-MATCHING NETWORK REALIZED IN MICROSTRIP TECHNIQUE

[75] Inventor: Vlad Pauker, Bievres, France

[73] Assignee: U.S. Philips Corporation, New York, N.Y.

[21] Appl. No.: 55,579

[22] Filed: Jul. 9, 1979

[30] Foreign Application Priority Data

Jul. 11, 1978 [FR] France ................................ 78 20678

[51] Int. Cl.³ .............................................. H01P 5/02
[52] U.S. Cl. ........................................ 333/34; 333/35
[58] Field of Search ............................ 333/34, 35, 246

[56] References Cited

U.S. PATENT DOCUMENTS

| 2,533,239 | 12/1950 | Gent et al. | 333/34 |
| 3,646,478 | 2/1972 | Ross | 333/34 X |
| 4,153,888 | 5/1979 | Cote | 333/34 X |

Primary Examiner—Paul L. Gensler
Attorney, Agent, or Firm—Thomas A. Briody; Robert T. Mayer; Robert J. Kraus

[57] ABSTRACT

An impedance-matching microstrip network for matching a predetermined impedance to a lower impedance over a wide frequency band having a tapered line section for transposing the predetermined impedance to a higher impedance. At least one quarter wave line section is coupled to the narrow end of the tapered line section for transposing the higher impedance to the lower impedance.

3 Claims, 13 Drawing Figures

IMPEDANCE-MATCHING NETWORK REALIZED IN MICROSTRIP TECHNIQUE

The invention relates to an impedance-matching network realized in microstrip technique for matching a predetermined impedance to a lower impedance over a wide frequency band, comprising a tapered line section.

Such impedance-matching networks are inter alia used in Gunn-diode oscillators which are tuned over a wide frequency band by means of a small ball of yttrium-iron garnate (YIG), placed in a static magnetic field.

Such an impedance-matching network is known from the German Patent Application No. 2,311,304, wherein the load impedance of approximately 50 Ohm is matched over a frequency band ranging from −25% to +25% of the center frequency to a diode impedance of approximately 5 to 7 Ohms, by means of the tapered line. This known matching network has the drawback that due to the occurrence of parasitic transversal modes it is not suitable for use at a high operating frequency, such as in a Gunn-oscillator which has an operating frequency equal to or greater than 3.2 to 3.3 GHz.

A tapered line section which has an impedance of, for example, 5 Ohms at its wide end requires a greatest width of 18.2 mm when a beryllium oxide substrate plate 0.635 mm thick is used. Such a width of the tapered line section at the low-ohmic side may make the occurrence of parasitic transversal modes possible at approximately 3.5 GHz, so that this width cannot be used at high frequencies, particularly for the above-mentioned Gunn-oscillators.

It is an object of the invention to provide an impedance-matching network wherein these drawbacks are obviated, which is suitable for use at a higher operating frequency or over a wider band and which has a predetermined, desired translated output impedance over the wide frequency band. The network may have, for example, a substantially constant value over the entire frequency range or an impedance which has a certain value which is lower for the frequency located at the ends of the band than for a frequency located in the center of the band.

The impedance-matching network according to the invention is therefor characterized in that the predetermined impedance is converted into a higher impedance by means of the tapered line section and in that this higher impedance is converted into the lower impedance by means of at least a $\frac{1}{4}\lambda$ line section.

The invention is based on the recognition of the fact that the stepping up of the high impedance to a higher impedance requires $\frac{1}{4}\lambda$ line sections having a higher characteristic impedance than for converting the higher impedance to the lower impedance than without stepping up, as a consequence of which the width of these $\frac{1}{4}\lambda$ line sections is smaller than half the wave length at the highest operating frequency, so that parasitic transversal modes cannot occur.

In accordance with a further feature of the invention, the impedance-matching network comprises two series-arranged $\frac{1}{4}\lambda$ line sections having mutually different characteristic impedances, the width of the $\frac{1}{4}\lambda$ line section having the lowest characteristic impedance being smaller than half the wave length of the highest frequency of the said frequency band.

This excludes the possibility of parasitic transversal modes.

In accordance with a still further feature the impedance-matching network comprises two series-arranged $\frac{1}{4}\lambda$ line sections having mutually different characteristic impedances, the characteristic impedance of the $\frac{1}{4}\lambda$ line section having the highest characteristic impedance being higher than the high impedance. This has the advantage that the impedance of the other $\frac{1}{4}\lambda$ line section can be chosen sufficiently high to suppress parasitic transversal modes.

In order to obtain a desired converted impedance over a wide band it may be necessary to use $\frac{1}{4}\lambda$ line sections which are dimensioned for mutually different frequencies.

The invention will now be further described with reference to embodiments shown in the accompanying Figures, the impedance-matching network being used in a Gunn-oscillator. Herein:

FIG. 1 shows a circuit diagram of a high frequency oscillator comprising an impedance-matching network according to the invention;

FIG. 2 shows a top view of a high frequency oscillator comprising an impedance-matching network according to the invention, FIG. 3 shows the circuit diagram of a prior art impedance-matching network in which a $\frac{1}{4}$ line section is used, FIG. 4 shows the Smith-chart which is related to the impedance-matching network shown in FIG. 3, FIG. 5 is a graph in which the load resistance applied to the Gunn-diode by the matching network shown in FIG. 2 is plotted as a function of the frequency, FIG. 6 shows the circuit diagram of a prior art impedance-matching network using two $\frac{1}{4}\lambda$ line sections, FIG. 7 shows the Smith-diagram which is related to the impedance-matching network the circuit diagram of which is shown in FIG. 6.

Figure 9:
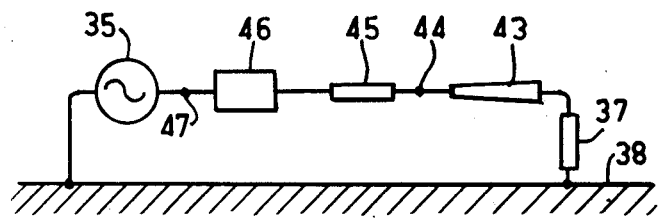
FIG. 9 shows schematically an impedance-matching network according to the invention.
Figure 10:
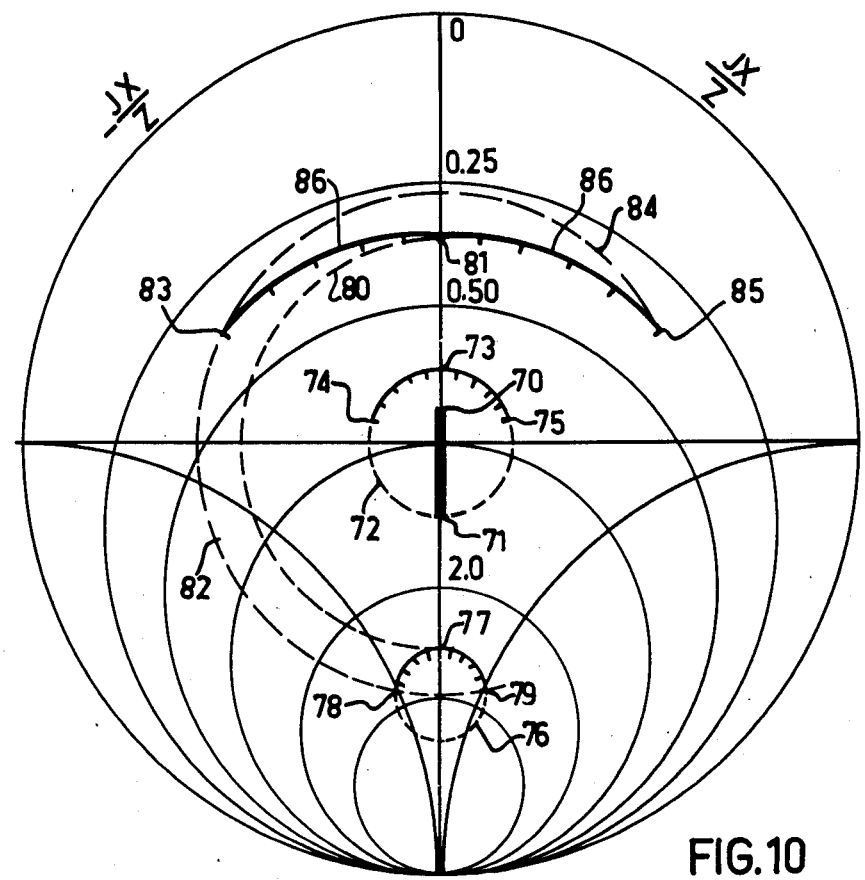
Figure 11:
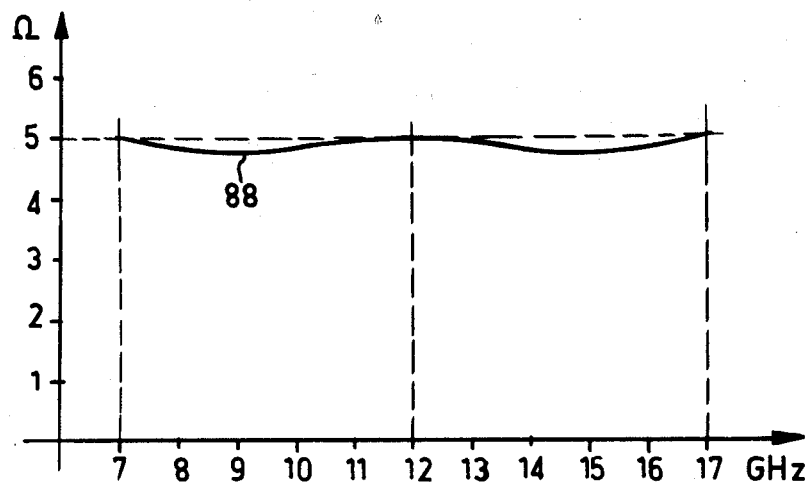
Figure 12:
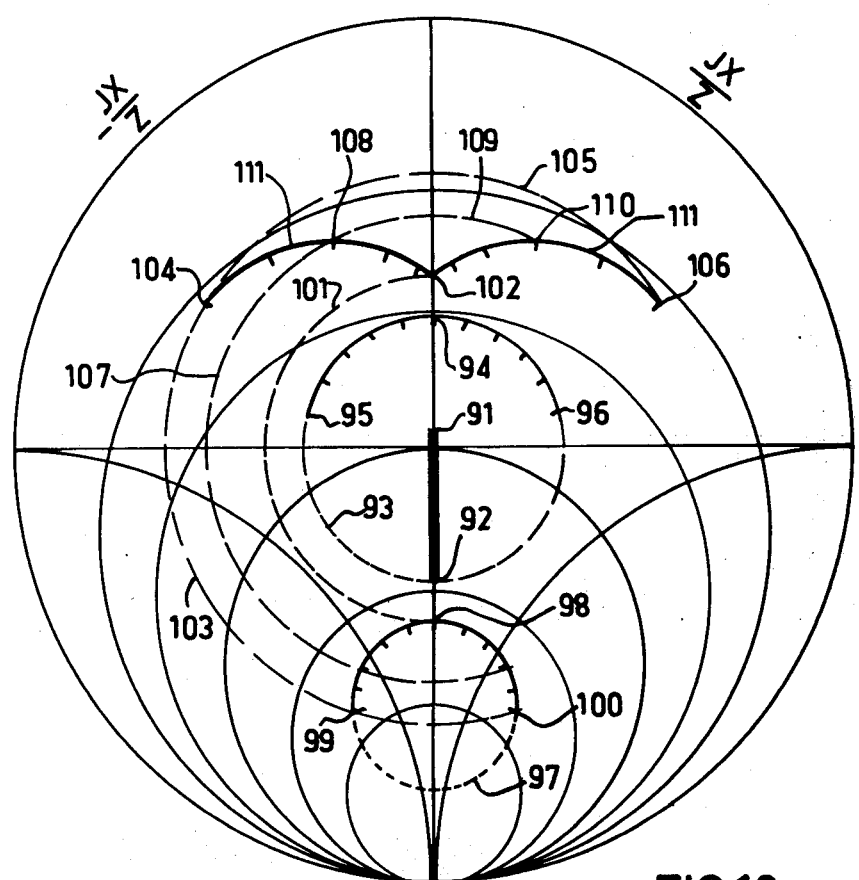
Figure 13:
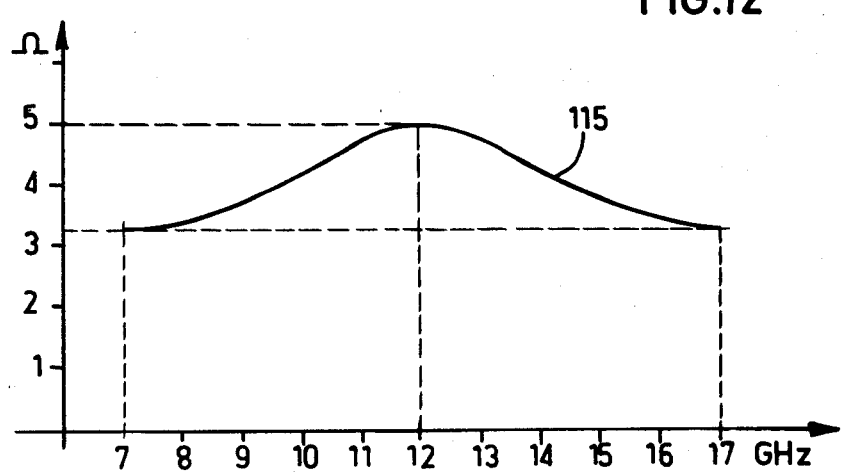

FIG. 10 shows the Smith-chart which relates to the emobidment of the impedance-matching network according to the invention shown in FIG. 9, FIG. 11 is a graph in which the load resistance applied to the Gunn-diode by the matching network shown in FIG. 9, is plotted as a function of the frequency, FIG. 12 shows the Smith-chart which relates to the second embodiment of the impedance-matching network according to the invention, and FIG. 13 is a graph in which there is plotted as a function of the frequency the variation of the load resistance applied to a Gunn-diode by the impedance-matching network whose operation is shown with reference to the Smith-chart shown in FIG. 12.

Figure 1:
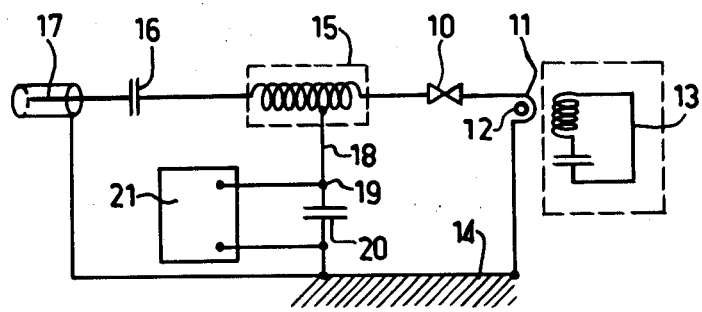

In order to illustrate in a simple manner in the circuit diagram shown in FIG. 1 the structure of the impedance-matching network used in a high-frequency oscillator, the complete oscillator (that is to say including the matching network) is shown as if it were fully realized by means of discrete components instead of distributed components.

One of the electrodes of a Gunn-diode 10 is connected to an end of a coupling winding 11 which comprises a little ball of yttrium-iron garnate provided in a magnetic field of a suitable strength; the electric equivalent of said little ball of yttrium garnate is shown in the drawing in the form of a resonant series arrangement 13 arranged in a rectangle, which is indicated by means of broken lines. The second end of said coupling winding 11 is connected to ground 14. One of the ends of an impedance-matching network 15 is connected to the second electrode of the Gunn-diode 10. A connecting capacitor 16 is provided between the second end of the matching network 15 and an output line 17 for the high-frequency signal; in addition to its function as a connecting element, said capacitor 16 prevents a d.c. voltage, applied to the diode 10, from occurring at the output terminal 17. A connection 18 is realized between an intermediate point of the matching network 15 and a supply terminal 19. This supply terminal 19 is decoupled from the high frequency by means of a capacitor 20 provided between this terminal 19 and ground 14. The oscillator is fed by a supply source 21 one end of which is connected to ground 14 and the other end to the supply terminal 19.

Figure 2:
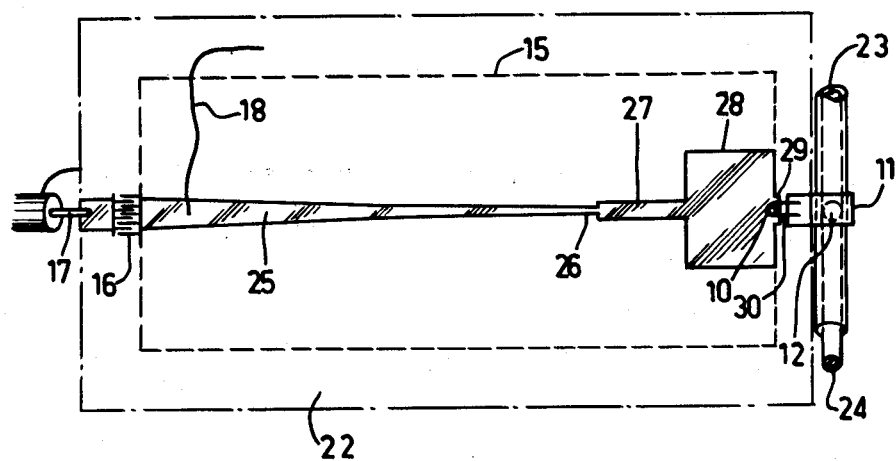

In FIG. 2 the components in the matching network according to the invention are shown in a rectangle 15 which is indicated by means of broken lines: from left to right in the drawing these elements are constituted by a tapered line section 25, the base of which is connected to the diagrammatically shown connecting capacitor 16 via a welded connection, whereas the narrow end 26 of said line 25 is extended by means of a first quarter-wave line section 27, the width of which is greater than the width of the tapered end 26 and which ends in a second quarter-wave line section 28, which is wider than the quarter-wave line 27.

The welded connecting of the Gunn-diode is exactly located in the extension of the right-hand edge of the quarter-wave line section 28; this was rendered possible by a small projecting portion 29, whose width is much smaller than the width of the quarter-wave line section 28. The upper electrode of the Gunn-diode 10 is connected to the coupling winding 11 by means of a double connecting formed by means of a U-shaped golden wire 30; the bend of this U is welded to the Gunn-diode by means of thermo-compression, whereas the ends of the two legs of said U are welded to the left-hand end of coupling wing 11, also by means of thermo-compression.

The conducting metal strips which form the line sections 25, 27 and 28 are applied by means of photo-etching of a copper layer which is provided on the upper surface of a substrate 22 made of a dielectric material, for example aluminium oxide $Al_2O_3$ or beryllium oxide BeO. The bottom surface of the substrate 22 is provided with a copper layer which forms the conducting plane 14, not shown in the drawing; advantageously, the metal line sections 25, 27 and 28 and the plane 14 are coated with a layer of gold, applied by means of a gold-plating procedure.

The little ball of yttrium-iron garnate 12, which is not visible from the outside, is represented in the drawing by means of a broken-line circle and is retained in an alumina tube 23 at the end of an alumina pin 24; by means of this known method of securing the ball it is possible to locate the ball 12 precisely in the center of the coupling winding 11 which is wound around the tube 23 and the second end of which, not shown in the Figure, is welded to the ground plane 24 provided on the bottom surface area of the substrate 22.

The output signal terminal of the oscillator is constituted by the center conductor 17 of a coaxial conductor, the characteristic impedance of which has a predetermined value, 50 Ohms in this embodiment, and the outer portion of which is connected to the base plane 14 which is not shown in the drawing.

In situ of the little yttrium-iron garnate ball 12 an electrical magnet, not shown, generates a magnetic field whose intensity is controllable and whose lines of force are perpendicular to the plane of the drawing.

In the following description with respect to the properties and pattern of behavior of the impedance-matching network according to the prior art and according to the matching networks according to the invention, the numerical examples are based on the assumption that the high-frequency oscillator covers a frequency band extending from 7 GHz to 17 GHz (mean frequency: 12 GHz), and that it has an optimum low load resistance of approximately 5 Ohms in the center of this frequency band, whereas the impedance of the coaxial conductor has a characteristic normalized impedance of 50 Ohms, which has an ohmic character. The above-mentioned load resistance is applied to the Gunn-diode by the matching network, whereas the load resistance of the little yttrium-iron-garnate ball, induced by the coupling winding, is neglected.

Figure 3:
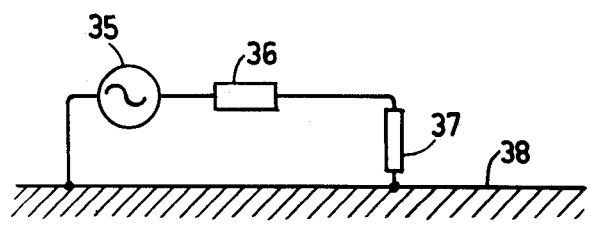

FIG. 3 shows schematically a high frequency oscillator 35 which is connected to an ohmic load resistor 37, having a value Zo, via a line section 36 having a characteristic impedance B, a length 1 and an attenuation constant $\alpha$ (expressed in nepers per unit of length) and a phase constant $\beta$ (expressed in radians per unit of length). The high-frequency circuit is terminated via a ground 38.

It is known that for the high frequency oscillator 35, the impedance Z of the series arrangement formed by the line section 36 and the load 37 is defined by the formula:

$$Z = B \frac{\frac{Z_o}{B} + tgh(\alpha + j\beta)1}{1 + \frac{Z_o}{B} tgh(\alpha + j\beta)1}$$

When the attenuation is small the above-mentioned formula is simplified to $$Z = B \frac{\frac{\frac{Z_o}{B} + \alpha 1}{1 + \frac{Z_o}{B}\alpha 1} + j\, tg\, \beta 1}{1 + j \frac{\frac{Z_o}{B} + \alpha 1}{1 + \frac{Z_o}{B}\alpha 1}}$$

If the attenuation of the line 36 may be neglected, the said formula becomes:

$$Z = B \frac{\frac{Z_o}{B} + j\, tg\, \beta\, 1}{1 + j\frac{Z_o}{B} tg\, \beta\, 1}$$

The term $\beta 1$ indicates in the above formulae the "electric length" of the line section 36, measured in units $\lambda/2\pi$, which corresponds to a phase difference of one radian.

$\beta$ expressed in the length of the line section 36, the frequency f of the signal and the speed of propagation c' of this signal in the line section 36 result in:

$$\beta \cdot 1 = \frac{2\pi 1 f}{c'}.$$

To simplify the structure of the formula which represents the impedance Z use can be made of the notation $$\gamma = tg\frac{2\pi 1 f}{c'},$$

and the formula becomes $$Z = \frac{B\left(\frac{Zo}{B} + j\gamma\right)}{1 + j\frac{Zo}{B}\gamma} \quad (1)$$

where, when it is assumed that $1=0$, Z becomes equal to Zo, whereas when it is assumed that $1=\lambda/4=c'/4f$, the value $Z=B^2/Zo$ is obtained.

For a line section which is a quarter-wave length long at a predetermined frequency the real (or ohmic) and the imaginary (or reactive) components of the impedance at frequencies differing from the values at which the line is a quarter-wave long can be calculated by means of the above-mentioned formula (1).

By means of the Smith-chart it is possible to determine rapidly and approximately, by means of a graph, the impedance value of the configuration shown in FIG. 3.

Figure 4:
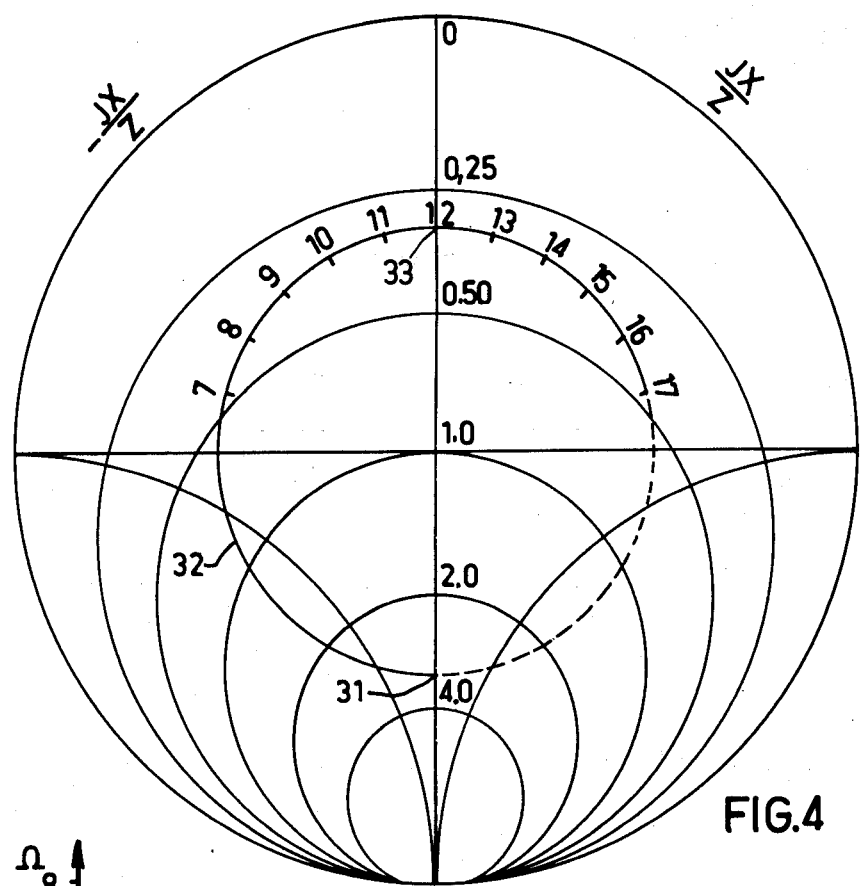

FIG. 4 is a Smith-chart used in analyzing the pattern of behavior of a quarter-wave line section having a characteristic impedance of 15.8 Ohms, which is tuned to the frequency 12 GHz and is used as an impedance-matching network having an external load resistance equal to 50 Ohms.

For an analysis of the pattern of behavior of this matching network by means of a Smith-chart there is plotted on the vertical axis of the diagram and in accordance with the real component of the impedance, a point 31 which is representative of the impedance of the ohmic load having a value $Zo=50$ Ohms when the characteristic impedance which is equal to 15.8 Ohm of the quarter-wave line section is taken as the characteristic basic impedance of the chart. Consequently, said point 31 corresponds to the ordinate 50 divided by $15.8=3.16$ Thereafter, the concentric circle 32 which passes through the point 31 is drawn; said circle 32 intersects the vertical axis of the chart in the point 33, which corresponds to a value equal to the inverted value of this point 31 and whose value is $1/3.16=0.316$.

In this chart, the basic impedance of which is 15.8 Ohm, the point 33, which is located on the circle 32 at an angular distance equal to $\lambda/4$ of the point 31, indicates that the impedance of the overall assembly is equal to 0.316 $Z=0.316\times15.8=4.99$ Ohms when the line section is tuned to $\lambda/4$ at 12 GHz.

When the operating frequency of the generator varies and deviates from the frequency 12 GHz, the length of the line is no longer equal to $\lambda/4$; the length becomes shorter than $\lambda/4$ at frequencies lower than 12 GHz and longer than $\lambda/4$ at frequencies above 12 GHz.

The arc of circle 32 is passed through clockwise from the point 31 at an increasing frequency, ending in the point which is representative of the impedance of the series arrangement of the "quarter-wave line section +- load". The length along the arc of the circle is proportional to the electric length of the line at the considered frequency, the complete circle corresponding to half a wavelength.

As the geometrical length of the quarter-wave line used corresponds to an electric length of $\lambda/4$ at the frequency 12 GHz and an arc length of 180°, the length of the arc at other frequencies is: for example, 105° for a frequency of 7 GHz, 120° for a frequency of 8 GHz, 135° for a frequency of 9 GHz, 150° for a frequency of 10 GHz, 165° for a frequency of 11 GHz, 195° for a frequency of 13 GHz, 210° for a frequency of 14 GHz, 250° for a frequency of 15 GHz, 240° for a frequency of 16 GHz and 255° for a frequency of 17 GHz.

In order to give a clear indication of the travel along the circle 32 of the point which is representative of the impedance, the positions on the circle 32 are indicated in Gigahertz.

Neglecting the fluctuations of the reactive component of the impedance to which the load subjects the generator via the impedance-matching network, the values of the real components of the said impedance are read from the chart. These values vary from 0.47 Z for the frequency of 7 GHz to 0.316 Z for the frequency of 12 GHz and becomes again equal to 0.47 Z for the frequency of 17 Ghz. So, it appears that the load resistance which is substantially equal to 5 Ohms at the frequency of 12 GHz, becomes equal to 7.4 Ohms for the frequencies of 7 GHz and 17 GHz, which is an impermissible increase of 48%.

Figure 5:
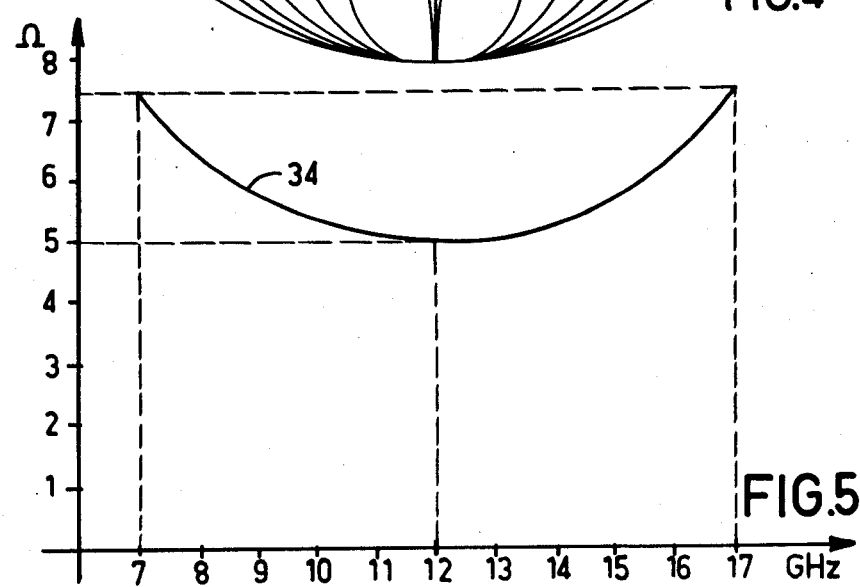

The curve 34 in FIG. 5 shows, as a function of the frequency, the variation of the load resistance applied to the Gunn-diode by the above-described impedance-matching network.

As regards the reactive component of the impedance, the component is capacitive at frequencies below 12 GHz and inductive for frequencies over 12 GHz; this component results in a small shift of the oscillator frequency relative to the resonant frequency of the small yttrium-iron garnate ball, in response to which the reactance of the oscillating circuit is automatically matched to the internal reactance of the Gunn-diode.

Figure 6:
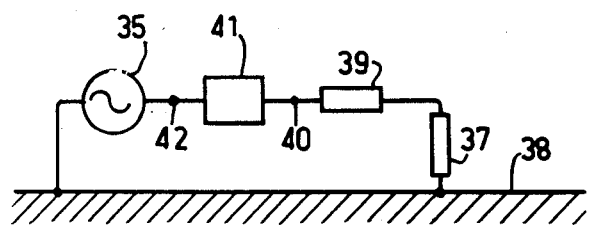

FIG. 6 shows schematically a high-frequency generator 35 which is connected to a load 37, having an ohmic value Zo by means of a matching network which, from said load 37 onwards, is formed by a first line section 39 having a characteristic impedance B and a length $1_1$, this line section not producing a noticeable attenuation, and by a second line section 41 having a characteristic impedance A and a length $1_2$ which does not produce a notable attenuation.

If the generator 35 were directly connected to point 40, which is common to the line section 39 and the line section 41, the impedance between this point 40 and ground 38 would be calculated by means of the above-mentioned formula (1).

When said impedance is denoted by $Z_1$ its value is given by:

$$Z = \frac{B\left(\frac{Zo}{B} + j\gamma 1\right)}{1 + j\frac{Zo}{B}\gamma 1}$$

where $$\gamma = tg \frac{2\pi l_1 f}{c'}$$

By means of recursion, the formula (1) can be used to calculate the impedance between the point of entrance 42 of the line section 41 and ground 38.

When this impedance is denoted by $Z_2$ its value is defined by:

$$Z_2 = A \frac{\frac{Z_1}{A} + j\gamma^2}{1 + \frac{Z_1}{A}\gamma_2}$$

where $$\gamma_2 = tg \frac{2\pi l_2 f}{c'} \qquad (2)$$

$$Z_2 = A \frac{B\left(\frac{Z_0}{B} + j\gamma_1\right)}{A\left(1 + j\frac{Z_0}{B}\gamma_1\right)} + j\gamma_2 \over 1 + j\gamma_2 \frac{B\left(\frac{Z_0}{B} + j\gamma_1\right)}{A\left(1 + j\frac{Z_0}{B}\gamma_1\right)}$$

where $$\gamma_1 = tg \frac{2\pi l_1 f}{c'} \text{ and } \gamma_2 = tg \frac{2\pi l_2 f}{c'}$$

When the line sections 39 and 41 are of the same length and at the frequency at which the line sections are precisely one quarter length long, formula (2) becomes $$Z_2 = Z_0 (A/B)^2$$

By means of the formula (2) it is possible to calculate the real (ohmic) component and the imaginary (reactive) component of the impedance $Z_2$ at frequencies which differ from the frequencies at which the line sections 39 and 41 are one quarter-wave long.

Figure 7:
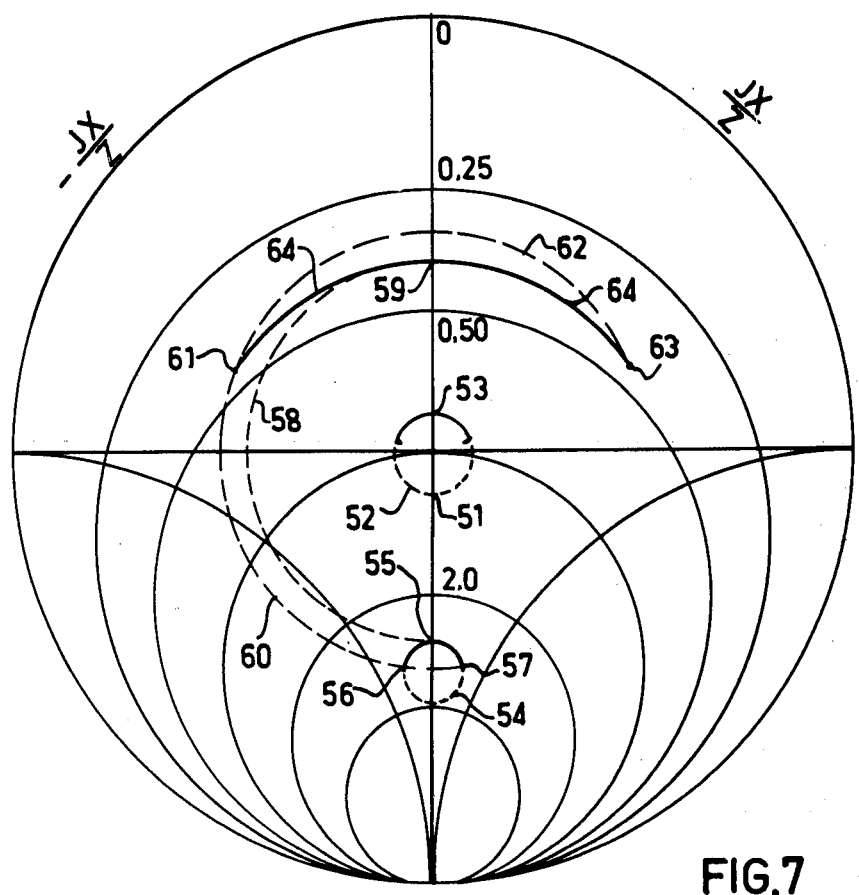

In FIG. 7 $Z_2$ is plotted in a Smith-chart, the load impedance 37 being $Z_o = 50$ Ohms, the characteristic impedance of the line section 31 being equal to 41.1 Ohms, whereas the characteristic impedance of the line section 41 is equal to 13 Ohms.

By means of this second embodiment of a prior art impedance-matching network an attempt is made to reduce the increase in the load resistance of the Gunn-diode towards the ends of the frequency band by using two quarter-wave line sections whose characteristic impedances are not lower than 12 Ohm in order to prevent transversal parasitic resonances from occurring at a frequency of 17 GHz. For this reason this matching section comprises a first quarter-wave line section tuned to the 12 GHz frequency and whose characteristic impedance is equal to 41.1 Ohms and a sedond quarter-wave line section which is also tuned to the frequency of 12 GHz and whose characteristic impedance is equal to 13 Ohms.

For the analysis of the operation of this circuit by means of a Smith-chart, a basic impedance of 41.1 Ohm was chosen for the chart, that is to say the chart is normalized at 41.1 Ohms. To that end a point 51 is plotted on the vertical axis of the diagram, which point is representative of the impedance of the ohmic load of 50 Ohms in the 41.1 Ohms plane: the y-value of the point 51 is then 50/41.1 = 1.21 Z. Thereafter, the central circuit 52 is drawn, which passes through the point 51 and intersects the vertical axis of the diagram in a point 53, the y-value of which is the reciprocal value of the value of point 51 and is equal to 0.82, which corresponds to an actual impedance of 33.8 Ohms.

To simplify the drawing, only the section of the circle 52 between the point 105° and the point 255° from the point 51 onwards is shown by means of a solid line, the remaining portion of the circle being shown by means of a broken line. The ends of the said arc of circle have a value of approximately $0.94 z - 0.18 jZ$ at a frequency of 7 GHz and a value $0.94 Z + 0.18 jZ$ at a frequency of 17 GHz.

Thereafter the circle 53 is transposed in a plane having a value of 13 Ohms as the normalized value (characteristic impedance of the second quarter-wave line section), which results in the circle 54, the useful portion of which is also shown by means of a solid line. In the line plane which has a normalized value of 13 Ohms the point 53 now becomes the point 55 with the ordinate 2.6 and the ends of the useful arc of the circle 52 become the points 56 and 57, the ordinate of which is approximately 3.0.

From the point 55 onwards a central arc of circle is drawn which has a length of 180° resulting in the point 59 on the vertical axis of the diagram. From the point 56 onwards a central arc of circle 60 is drawn, which has a length of 105° resulting in the point 61, which has the frequency of 7 GHz as parameter. From the point 57 onwards a central arc of circle 62 is drawn which has a length of 255° and which partly coincides with the arc of circle 60, resulting in the point 63 which has frequency of 17 GHz as parameter.

Effecting the same operation for the intermediate points of the useful arc of the circle 54 results, in the points for the curve 64, which curve is substantially in the shape of an arc of the circle. The abcissa of the point 59 is located at 0.38 Z, which corresponds to 5 Ohms, whereas the abcissas of the points 61 and 63 are equal to 0.45 Z, which corresponds to approximately 5.9 Ohms.

The change in the load resistance between the point located in the center of the frequency band and the ends of said band is much smaller than in the examples of FIGS. 3 and 4, namely +18% instead of +48%, but this change is detrimental to the values required for a proper operation of the Gunn-diode in the overall frequency band to be covered.

Figure 8:
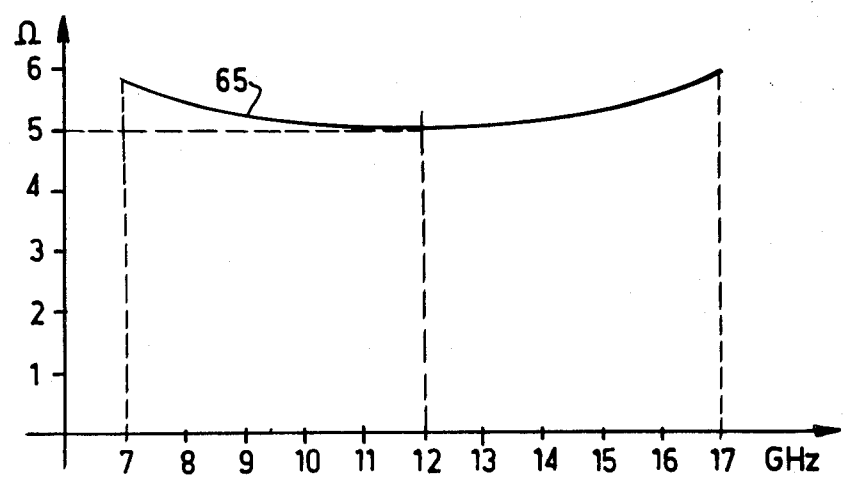
FIG. 8 is a graph in which the load resistance applied to the Gunn-diode by the impedance-matching network shown in FIG. 6 is plotted as a function of the frequency.

The curve 65 shown in FIG. 8 shows the fluctuations in the impedance as a function of the frequency such as this impedance is applied to the Gunn-diode by the matching network, as analyzed in FIG. 7.

FIG. 9 shows schematically an impedance-matching network in accordance with the invention. In this matching network the input of the output impedance 37, having the impedance Zo is connected to the base of a tapered line section 43, which is used as an impedance transformer by means of which an increase in the impedance value is realized over a wide frequency band. The predetermined impedance, in this case the characteristic impedance at the base of the said line 43, is equal to Zo and the characteristic impedance of the narrow end of the tapered line section 43 is equal to L. The narrow end of the line 43 is connected to a quarter-wave line section 45, which has a negligible attenuation and a characteristic impedance equal to B and a length $l_1$. The quarter-wave line section 45 itself is connected to a second quarter-wave line section 46, which has a negligible attenuation and a characteristic impedance equal to A and a length $l_2$, the input of this line section 46 being connected to the output of the high-frequency generator 35.

The presence of the tapered line 43 causes the impedance between the input point 44 of the line 43 and the ground 38 to be equal to L and, when $Z_3$ is the impedance between the input point 47 of the line section 46 and ground 38, formula (2) changes into:

$$Z_3 = A \frac{\dfrac{B\left(\dfrac{L}{B} + j\gamma_1\right)}{A\left(1 + j\dfrac{L}{B}\gamma_1\right)} + j\gamma_2}{1 + j\gamma_2 \dfrac{B\left(\dfrac{L}{B} + j\gamma_1\right)}{A\left(1 + j\dfrac{L}{B}\gamma_1\right)}} \tag{3}$$

where $$\gamma_1 = tg\frac{2\pi l_1 f}{c'} \text{ and } \gamma_2 = tg\frac{2\pi l_2 f}{c'}$$

At the frequency at which each of the line sections 45 and 46 are $\tfrac{1}{4}\lambda$ long, formula (3) becomes very simple, namely $$Z_3 = L(A/B)^2$$

Using formula (3) it is possible to calculate the real and the imaginary components of the impedance $Z_3$ at frequencies which differ from the frequency at which the line sections 45 and 46 are a quarter-wave long.

FIG. 10 shows a Smith chart wherein the impedance-matching network according to the invention shown in FIG. 9 is explained in greater detail. The higher characteristic impedance value L of the narrow end of the tapered line 43 has been chosen equal to 80 Ohms, whereas the characteristic impedance of the quarter-wave line section 45 is 57.2 Ohms and the characteristic impedance of the quarter-wave line section 46 is 14.3 Ohms, these two line sections 46, 45 being $\tfrac{1}{4}\lambda$ long at a frequency of 12 GHz.

The impedances shown in the Smith chart of this impedance-matching network according to the invention are normalized at 57.2 Ohms, which value corresponds to the value of the characteristic impedance of the first quarter-wave line section. On the vertical axis of the chart the point 70 has a value equal to 0.87 Z, which represents the load $Z_0 = 50$ Ohms and the point 71 has a value equal to $80/53.7 = 1.4$ Z, which represents the narrow end of the tapered line section having an impedance of 80 Ohm. The transition from the impedance value 50 Ohm to the impedance value 80 Ohm without the use of a reactive impedance component is represented by the solid line between the points 70 and 71.

Thereafter, a central circle 72 is drawn which passes through the point 71 and further intersects the vertical axis of the chart in a point 73 at a value equal to $1/1.4 = 0.715$ Z. The relevant portion, shown by means of the solid line, of the circle 72 is limited on the left-hand side by a point 74 which represents the impedance at a frequency of 7 GHz, its phase being shifted 105° with respect to the point 71, and on the right-hand side it is limited by a point 75 the phase of which is shifted 255° with respect to the point 71 which represents the impedance at a frequency of 17 GHz. The intermediate points were plotted while taking the normalized scale into account. The impedance value corresponding to the points 74 and 75 are approximately $0.875\,Z - 0.29\,jZ$ and $0.875\,Z + 0.29\,jZ$, respectively.

Thereafter, the characteristic impedance of the second quarter-wave line section is taken as the normalized impedance in the chart, that is to say the value 14.3 Ohms, and the circle 72 is transposed to the plane of 14.3 Ohms; this results in the circle 76. By means of transposition the point 73 becomes point 77, having the value 2.86; and the coordinates of the points 74 and 75 are transposed to the points 78 and 79, respectively, which have the value $3.5\,Z - 1.16\,jZ$ and $3.5\,Z + 1.16\,jZ$, respectively; at the same time the parameters in Gigahertz of the relevant portion of the circle 72 are transferred to the circle 76.

In the Smith-chart which has a normalized impedance of 14.3 Ohms, it is then possible to draw the impedance curve as a function of the frequency, of the impedance-matching network according to the invention.

To that end, the central arc of circle 80 is drawn, which has a length of 180° from the point 77 onwards, resulting in the point 81 on the vertical axis of the chart. Thereafter, the central arc of circle 82 is drawn which has a length of 105° from the point 78 onwards, resulting in the point 83. Thereafter, the arc of circle 84 is drawn which has a length of 255° and partly coincides with the arc of circle 82 from the point 79 onwards, resulting in the point 85, etc.

The value of the point 81 is 0.35 Z (which corresponds to a load resistance of 5 Ohm), and the coordinates of the points 83 and 85 are $0.35\,Z - 0.58\,jZ$ and $0.35\,Z + 0.58\,jZ$, respectively, which also corresponds to a real load resistance of 5 Ohm. A very weak minimum of the load resistance is present near the frequencies 9 GHz and 15 GHz, which minimum is approximately 4.76 Ohms.

In FIG. 11 the curve 88 shows the load impedance as a function of the frequency applied to the Gunn-diode by the impedance-matching network which is analysed in FIG. 10.

FIG. 12 shows a Smith-chart of a further impedance-matching network according to the invention; this network has the same structure as the network shown in FIG. 9 but for the characteristic impedance value L of the narrow end of the tapered line 43 which, in this case, is 100 Ohm, whereas the characteristic impedance of the quarter-wave line section 45 is equal to 43.7 Ohms and the characteristic impedance of the quarter-wave line section 46 is equal to 12 Ohms, both line sections being $\tfrac{1}{4}\lambda$ long at a frequency of 12 GHz.

The impedances shown in the Smith-chart of FIG. 12 are normalized at an impedance of 53.7 Ohm, which corresponds to the characteristic impedance value of the first quarter-wave line section. A point 91, having the value 0.93Z and representing a load impedance $Z_0 = 50$ Ohms is plotted on the vertical axis of the chart, and a point 92 having a value $100/53.7 = 1.86\,Z$ is plotted, which represents the narrow end of the line section 43 which has a characteristic impedance value of 100 Ohms. The conversion of the impedance value of 50 Ohms to the impedance value of 100 Ohms is represented by the solid line between the points 91 and 92.

Thereafter, a central circle 93 is drawn which passes through the point 92 and intersects the vertical axis of the chart in a point 94 which has a value equal to $1/1.86 = 0.537$. The relevant portion of the circle 93, which portion is shown by means of a solid line, is limited on the left-hand side by a point 95, which is located at an angular distance of 105° from the point 92 along the circle 93 and which represents the impedance at the frequency of 7 GHz, whereas this relevant portion is limited on the right-hand side by a point 96, which is located at an angular distance of 255° from the point 92 along the circle 93 and which represents the impedance at a frequency of 17 GHz. The impedance values corresponding to the points 95 and 96 are approximately $0.72 - 0.47$ jZ and $0.72 Z + 0.47$ jZ, respectively.

Drawing of the chart is then continued by taking the characteristic impedance of the second quarter-wave line section as the normalized impedance, namely a 12 Ohm impedance; the circle 93 is transferred to the 12 Ohm plane, resulting in the circle 97. The point 94 becomes the point 98 having the value $(0.537 \cdot 53.7/12) = 2.40$ Z and the coordinates of the points 99 and 100, which corresponds to the points 95 and 96, respectively, have a value of $3.22 Z - 2.1$ jZ and $3.22 Z + 2.1$ jZ, respectively.

It is then possible to draw in the Smith-diagram normalized at 12 Ohm, the response curve of the impedance as a function of the frequency with respect to the considered impedance-matching network.

To this end, the central arc of circle 101 is drawn with a length of 180° from the point 98 onwards, which results in the point 102 on the vertical axis of the chart. Thereafter, the central arc of circle 103 is drawn with a length of 105° from the point 99 onwards, resulting in the point 104. Thereafter, the central arc of circle 105 is drawn with a length of 255° and partly coinciding with the arc of circle 103 from the point 100 onwards, which results in the point 106. Thereafter, the central arc of circle 107 is drawn with a length of 135° from the point at 9 GHz of the circle 97, which results in the point 108. Thereafter, the central arc of circle 109 is drawn with a length of 255° and partly coinciding with the arc of circle 107 from the point at 15 GHz of the circle 97 onwards, which results in the point 110.

Drawing of the chart is then continued from the other points plotted on the circle 97, which results in the other points, whereafter the curves 111 are drawn.

The point 102 has a value of 0.416 Z (which corresponds to a load resistance of 5 Ohm) and the coordinates of the points 104 and 105 have a value of approximately $0.275 - 0.52$ jZ and $0.275 + 0.52$ jZ, respectively, which corresponds to load resistances of $0.275 \times 12 = 3.3$ Ohms.

This embodiment of the invention results in a reduction of 34% of the load resistance applied to the Gunn-diode at the ends of the frequency band covered and is, consequently, very advantageous in this application for maintaining an oscillation of a sufficient amplitude as far as the ends of the frequency band to be covered.

The curve 115 shown in FIG. 13 shows the load impedance as a function of the frequency applied to the Gunn-diode by the impedance-matching network, this network having been analyzed with reference to FIG. 12.

It is not simple to use the formula (3) by means of which it is possible to calculate the components of the load impedance of the Gunn-diode, which are produced by the impedance-matching network according to the invention.

By way of simplification it is therefore assumed that the two quarter-wave line sections are $\frac{1}{4}\lambda$ long at the same frequency fo.

If it is assumed that $g = tg \, \pi/2 \, f/fo$, the following formula is obtained:

$$Z_3 = A \frac{LAB^2(1 + g^2)^2 + jg(A + B)[B(AB - L^2) + g^2(AL^2 - B^3)]}{B^2(A - g^2 B)^2 + g^2 L^2 (A = B)^2} \tag{4}$$

On the basis of the formula (4) and the following data: the optimum load resistance Ro to be applied by the impedance-matching network according to the invention to the Gunn-diode at the frequency fo, the characteristic impedance value of the narrow end of the tapered line 43, the minimum $f_{min}$ and maximum $f_{max}$ frequency values of the frequency band to be covered and the desired frequency depending on the load resistance as a function of the frequency, it is possible to determine the characteristic impedance values A and B of the quarter-wave line sections 46 and 45.

To that end the square root of the ratio Ro/L is defined as b, so $b = \sqrt{Ro/L}$ and h is defined as $h = tg \, \pi/2 \, f \, min/fo$.

In addition, a coefficient $k_{11}$ is calculated the value of which is defined by $$k_{11} = \sqrt{\frac{1 + b}{2} \cdot \frac{h^2 - 1}{h^2 - b}}$$

to obtain the curve shown in FIG. 11, and the impedances B and A are determined by means of the formulae:

$$B_{11} = L \times k_{11} \text{ and } A_{11} = B_{11} \times b.$$

In order to realize the curve shown in FIG. 13 a coefficient $k_{13}$ must be calculated the value of which is defined by:

$$k_{13} = \sqrt{\frac{(1 + b)h^2}{2h^2 + 1 - b}}$$

and the impedances B and A are determined by means of the formulae:

$$B_{13} = L \times k_{13} \text{ and } A_{13} = B_{13} \times b.$$

There now follows a description of two examples in which this method is used with respect to an oscillator whose $f_{min} = 7$ GHz and $f_{max} = 17$ GHz, and wherein two quarter-wave line sections are $\frac{1}{4}\lambda$ long at a frequency $f_o = 12$ GHz in order to obtain a load resistance Ro = 5 Ohm at a normalized output impedance value Zo = 50 Ohm.

The value of the coefficient h is:

$$h = tg\pi/2(7/12) = 1.3032$$

| L Ohm | b | h | Impedance curve as shown in | k | B Ohm | A Ohm |
|---|---|---|---|---|---|---|
| 80 | 0,250 | 1,3032 | FIG. 11 | 0,715 | 57,2 | 14,3 |
| 100 | 0,2236 | 1,3032 | FIG. 13 | 0,538 | 53,8 | 12,0 |

The impedance-matching networks determined in this manner are the networks which have been explained in further detail in the Smith-chart of FIGS. 10 and 12.

When an impedance variation is desired which is between the curve shown in FIG. 11 and the curve shown in FIG. 13, the corresponding coefficients $k_{11}$ and $k_{13}$ are calculated and interpolation is effected between the values $k_{11}$ and $k_{13}$, which were obtained for the determination of an intermediate value $k_i$ by means of which the impedance values B and A can be obtained, whereafter an impedance curve with precise interpolation can be drawn.

To obtain a permissible value for the characteristic impedance A, that is to say a value which does not result in a width of the $\frac{1}{4}\lambda$ line section which entails the risk of transversal parasitic resonances in the upper portion of the frequency range (at 17 GHz in the case considered here) the control in the above-mentioned manner by the value of the impedance L, the value of the impedance. A increases as the value of L itself increases.

The experiments and the calculations performed after the impedance-matching network according to the invention had been realized, confirmed this fact in all respects.

In this embodiment it appears to be advantageous when a value is chosen for the characteristic impedance of the narrow end of the line section which is so high that the characteristic impedance of first quarter-wave line section exceeds 50 Ohms.

It should be noted that the impedance-matching network which was described with reference to its use in a Gunn-oscillator can be used for any type of impedance match, there being a risk that transversal oscillations occur when the network is realized in micro-strip techniques, due to the low value of the impedance to be matched and a high operating frequency.

What is claimed is:

1. An impedance-matching micro-strip network for matching a predetermined impedance to a lower impedance over a wide frequency band, comprising a tapered line section for transposing the predetermined impedance to a higher impedance and at least one quarter wave line section on the narrow end of said tapered line section for transposing this higher impedance to the lower impedance.

2. An impedance-matching network as claimed in claim 1, wherein said at least one quarter wave line section comprises two series-arranged quarter wave line sections having mutually different characteristic impedance, the width of the quarter wave line sections having the lowest characteristic impedance being smaller than half the wavelength of the highest frequency of the said frequency band.

3. An impedance-matching network as claimed in claim 1, wherein said at least one quarter wave line section comprises two series-arranged quarter wave line sections having mutually different characteristic impedances, the characteristic impedance of the quarter wave line section having the highest characteristic impedance being greater than said higher impedance.

* * * * *